United States Patent
Oh

(10) Patent No.: US 10,700,081 B2
(45) Date of Patent: Jun. 30, 2020

(54) SEMICONDUCTOR MEMORY DEVICE

(71) Applicant: SK hynix Inc., Gyeonggi-do (KR)

(72) Inventor: Sung-Lae Oh, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/209,030

(22) Filed: Dec. 4, 2018

(65) Prior Publication Data

US 2020/0058670 A1    Feb. 20, 2020

(30) Foreign Application Priority Data

Aug. 16, 2018 (KR) .......................... 10-2018-0095641

(51) Int. Cl.

| H01L 27/11575 | (2017.01) |
| H01L 23/52 | (2006.01) |
| H01L 23/522 | (2006.01) |
| H01L 23/528 | (2006.01) |
| H01L 27/11524 | (2017.01) |
| H01L 27/11573 | (2017.01) |
| H01L 27/11548 | (2017.01) |
| H01L 27/11529 | (2017.01) |
| H01L 27/1157 | (2017.01) |
| H01L 27/11582 | (2017.01) |
| H01L 27/11556 | (2017.01) |

(52) U.S. Cl.
CPC .... *H01L 27/11575* (2013.01); *H01L 23/5225* (2013.01); *H01L 23/5226* (2013.01); *H01L 23/5286* (2013.01); *H01L 27/1157* (2013.01); *H01L 27/11524* (2013.01); *H01L 27/11529* (2013.01); *H01L 27/11548* (2013.01); *H01L 27/11556* (2013.01); *H01L 27/11573* (2013.01); *H01L 27/11582* (2013.01)

(58) Field of Classification Search
CPC ....................... H01L 27/11575; H01L 23/5225
USPC ......................................................... 257/314
See application file for complete search history.

(56) References Cited

U.S. PATENT DOCUMENTS

| 4,941,031 A * | 7/1990 | Kumagai ............ G11C 11/4097 257/296 |
| 2011/0121455 A1* | 5/2011 | Yoon ..................... H01L 23/522 257/741 |

(Continued)

FOREIGN PATENT DOCUMENTS

KR    10-2019-0020897    3/2019

*Primary Examiner* — Fazli Erdem
(74) *Attorney, Agent, or Firm* — IP & T Group LLP

(57) ABSTRACT

A semiconductor memory device includes gate lines and wiring lines which are stacked over a substrate. The gate lines are stacked over first and second cell array regions of a substrate which are disposed in a second direction crossing with a first direction, and are passed through by channel structures. The wiring lines are stacked over an interval region of the substrate which is disposed between the first and second cell array regions and over first coupling regions of the substrate which are disposed at both sides of the first and second cell array regions and the interval region in the first direction. Each of the wiring lines includes a line portion which traverses the interval region in the first direction and extended portions which are disposed over the first coupling regions. A width of the extended portions is larger than a width of the line portion.

20 Claims, 13 Drawing Sheets

(56) References Cited

U.S. PATENT DOCUMENTS

2014/0241026 A1\* 8/2014 Tanzawa ................ G11C 5/063
 365/72
2017/0179025 A1\* 6/2017 Yun .................... H01L 21/76816
2017/0207238 A1\* 7/2017 Lee .................... H01L 27/11565

\* cited by examiner

SEMICONDUCTOR MEMORY DEVICE

CROSS-REFERENCE TO RELATED APPLICATION

The present application claims priority to Korean Patent Application No. 10-2018-0095641 filed in the Korean Intellectual Property Office on Aug. 16, 2018, which is incorporated herein by reference in its entirety.

BACKGROUND

1. Technical Field

Various embodiments of the present invention generally relate to a semiconductor memory device. Particularly, the embodiments relate to a semiconductor memory device of a three-dimensional structure.

2. Related Art

In order to obtain excellent performance and low cost that consumers demand, the degree of integration of a semiconductor memory device needs to be increased. In the case of a two-dimensional or planar semiconductor memory device, since a degree of integration is determined by the area occupied by a unit memory cell, the degree of integration is greatly influenced by the level of a fine pattern forming technique. However, since expensive equipment is required for the fine formation of a pattern, the degree of integration of a two-dimensional semiconductor memory device is limited. In order to overcome such a limitation, semiconductor memory devices of a three-dimensional structure in which memory cells are arranged three-dimensionally have been developed.

As the size of a memory cell decreases, the structures of operating circuits and wiring lines included in a semiconductor memory device for the operation and electrical coupling of the semiconductor memory device have become increasingly complicated. Thus, a memory device with improved degree of integration and excellent electrical characteristics is demanded.

SUMMARY

In an embodiment, a semiconductor memory device may include a plurality of gate lines and a plurality of wiring lines which are stacked over a substrate. The gate lines may be stacked over a first cell array region and a second cell array region of a substrate which are disposed in a second direction crossing with a first direction, and may be passed through by channel structures. The wiring lines may be stacked over an interval region of the substrate which is disposed between the first cell array region and the second cell array region and over first coupling regions of the substrate which are disposed at both sides of the first and second cell array regions and the interval region in the first direction. Each of the wiring lines may include a line portion which traverses the interval region in the first direction and extended portions which are disposed over the first coupling regions. In the second direction, a width of the extended portions may be larger than a width of the line portion.

In an embodiment, a semiconductor memory device may include: a first substrate defined with first and second cell array regions which are disposed in a second direction crossing with a first direction, an interval region between the first cell array region and the second cell array region, first coupling regions which are disposed at both sides of the first and second cell array regions and the interval region in the first direction and second coupling regions which are disposed at both sides of the first and second cell array regions and the interval region in the second direction; gate line stacks including a plurality of gate lines which are disposed over the first and second cell array regions and the second coupling regions of the first substrate, extend from the first and second cell array regions to the second coupling regions adjacent thereto and are vertically stacked; and wiring line stacks including a plurality of wiring lines which are disposed over the interval region and the first coupling regions of the first substrate and are vertically stacked. The gate lines may have a first step structure which is formed in the second direction in each of the second coupling regions, and the wiring lines may have a second step structure which is formed in the first direction in each of the first coupling regions.

In an embodiment, a semiconductor memory device may include: a plurality of gate lines stacked over aligned first and second cell array regions; and a plurality of wiring lines stacked over a region between and at opposite sides of the cell array regions. Each of the wiring lines includes a first portion having a relatively narrower width and running between and across the cell array regions and second portions having a relatively wider width and running at opposite sides of and along with the cell array regions.

DETAILED DESCRIPTION

Hereinafter, a semiconductor memory device will be described below with reference to the accompanying drawings through various examples of embodiments.

Figure 1:
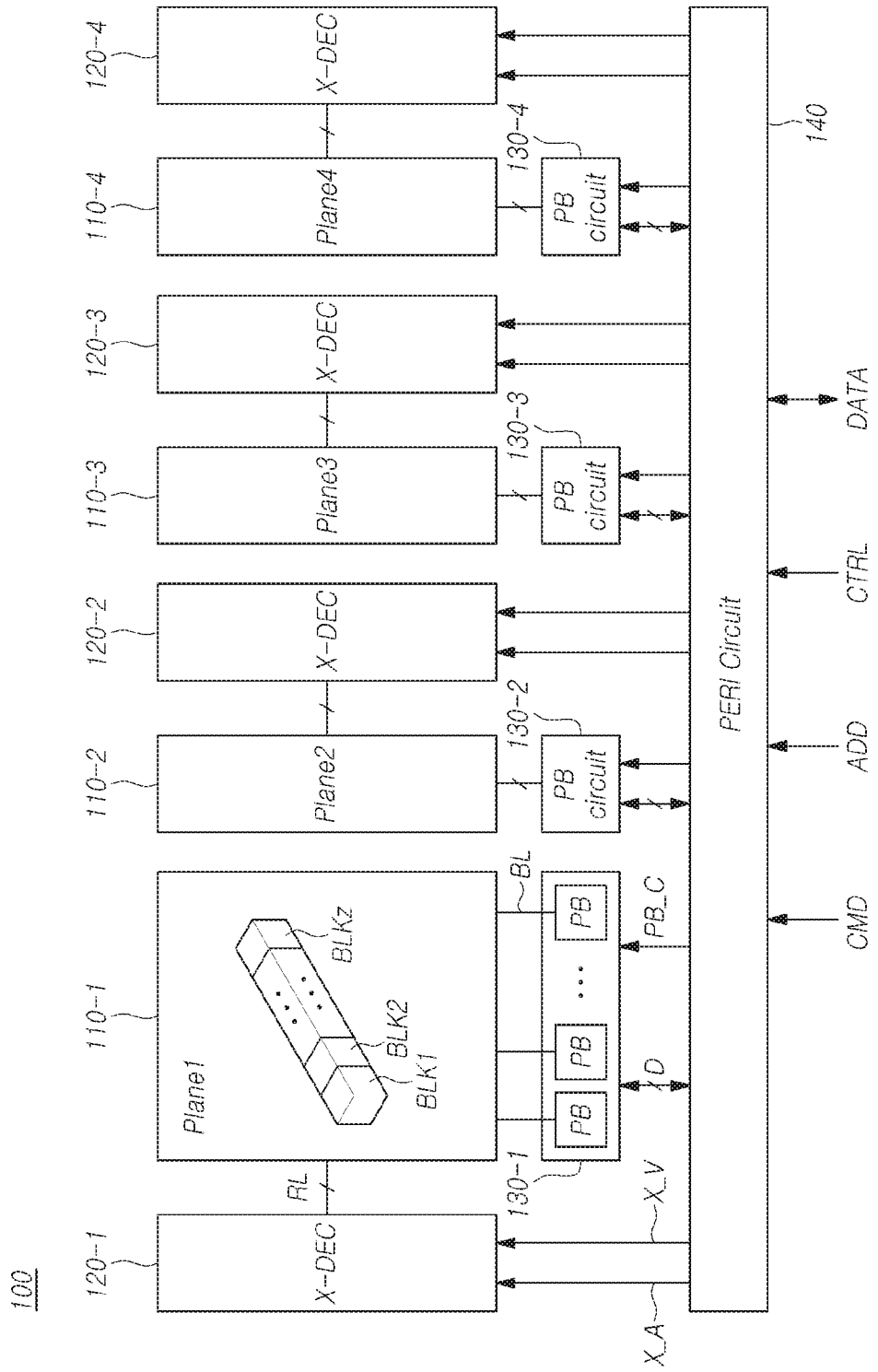
FIG. 1 is a block diagram illustrating an example of a semiconductor memory device in accordance with an embodiment.

FIG. 1 is a block diagram illustrating an example of a semiconductor memory device 100 in accordance with an embodiment.

Referring to FIG. 1, the semiconductor memory device 100 in accordance with an embodiment may include a plurality of planes 110-1 to 110-4, a plurality of row decoders 120-1 to 120-4, a plurality of page buffer circuits 130-1 to 130-4 and a peripheral circuit 140.

A peripheral circuit 140 may refer to components which are included in the semiconductor memory device 100, except the planes 110-1 to 110-4, the row decoders 120-1 to 120-4 and the page buffer circuits 130-1 to 130-4.

While it is illustrated in the embodiment to be described with reference to the drawing that the semiconductor memory device 100 includes four planes, it is to be noted that the number of planes is not limited thereto. That is, the number of planes in the semiconductor device 100 may vary depending on design requirement.

Each of the planes 110-1 to 110-4 may include a plurality of memory cells which have states corresponding to the data stored therein. Each memory cell may be accessed by a word line and a bit line. Each memory cell may be a volatile memory cell which loses data stored therein in the case where power supply is interrupted, or may be a nonvolatile memory cell which retains data stored therein even though power supply is interrupted. While it is described below that the semiconductor memory device 100 is a vertical NAND flash device, it is to be understood that the technical spirit of the present disclosure is not limited thereto.

Each of the planes 110-1 to 110-4 may include a plurality of memory blocks BLK1 to BLKz. A memory block may correspond to an erase unit. Each of the memory blocks BLK1 to BLKz may include a plurality of cell strings. Each cell string may include at least one drain select transistor, a plurality of memory cells and at least one source select transistor which are coupled in series.

The planes 110-1 to 110-4 may be respectively coupled to the corresponding row decoders 120-1 to 120-4 through row lines RL. Row lines RL may be provided for each of the memory blocks BLK1 to BLKz. The row lines RL may include one or more drain select lines, a plurality of word lines and one or more source select lines.

The planes 110-1 to 110-4 may be respectively coupled to the corresponding page buffer circuits 130-1 to 130-4 through bit lines BL. The planes 110-1 to 110-4 may be independently controlled and operated (for example, program operations and read operations) through the page buffer circuits 130-1 to 130-4. By being controlled independently of one another in this way, the planes 110-1 to 110-4 may perform specific operations in parallel or individually.

Each of the row decoders 120-1 to 120-4 may select any one among the memory blocks BLK1 to BLKz included in a corresponding plane, in response to a row address X_A provided from the peripheral circuit 140. Each of the row decoders 120-1 to 120-4 may transfer an operating voltage X_V provided from the peripheral circuit 140, to row lines RL which are coupled to a selected memory block.

Each of the page buffer circuits 130-1 to 130-4 may include a plurality of page buffers PB which are coupled to bit lines BL, respectively. Each of the page buffer circuits 130-1 to 130-4 may receive a page buffer control signal PB_C from the peripheral circuit 140, and may transmit and receive a data signal D to and from the peripheral circuit 140. Each of the page buffer circuits 130-1 to 130-4 may control bit lines BL which are arranged in a corresponding plane, in response to the page buffer control signal PB_C. For example, each of the page buffer circuits 130-1 to 130-4 may detect data stored in the memory cells of a corresponding plane by sensing the signals of the bit lines BL of the corresponding plane in response to the page buffer control signal PB_C, and may transmit the data signal D to the peripheral circuit 140 depending on the detected data. Each of the page buffer circuits 130-1 to 130-4 may apply signals to bit lines BL based on the data signal D received from the peripheral circuit 140 in response to the page buffer control circuit PB_C, and thereby, may write data in the memory cells of the corresponding plane. Each of the page buffer circuits 130-1 to 130-4 may write data in or read data from the memory cells coupled to a word line which is activated by each of the row decoders 120-1 to 120-4.

The peripheral circuit 140 may receive a command signal CMD, an address signal ADD and a control signal CTRL external to the semiconductor memory device 100, and may transmit and receive data DATA to and from a device external the semiconductor memory device 100, for example, a memory controller (not shown). The peripheral circuit 140 may output signals for writing data in the planes 110-1 to 110-4 or reading data from the planes 110-1 to 110-4, for example, the row address X_A, the page buffer control signal PB_C and so forth, based on the command signal CMD, the address signal ADD and the control signal CTRL. The peripheral circuit 140 may generate various voltages including the operating voltage X_V, which are required in the semiconductor memory device 100.

Hereinbelow, in the accompanying drawings, two directions that are parallel to the top surface of a substrate and intersect with each other are defined as a first direction FD and a second direction SD, respectively, and a direction that is perpendicular to the top surface of the substrate is defined as a third direction TD. The first direction FD may correspond to the extending direction of bit lines BL or the arrangement direction of row lines RL, and the second direction SD may correspond to the extending direction of the row lines RL or the arrangement direction of the bit lines BL. The first direction FD and the second direction SD may substantially perpendicularly intersect with each other. In the drawings, a direction indicated by an arrow and a direction opposite thereto will be considered as the same direction.

Figure 2:
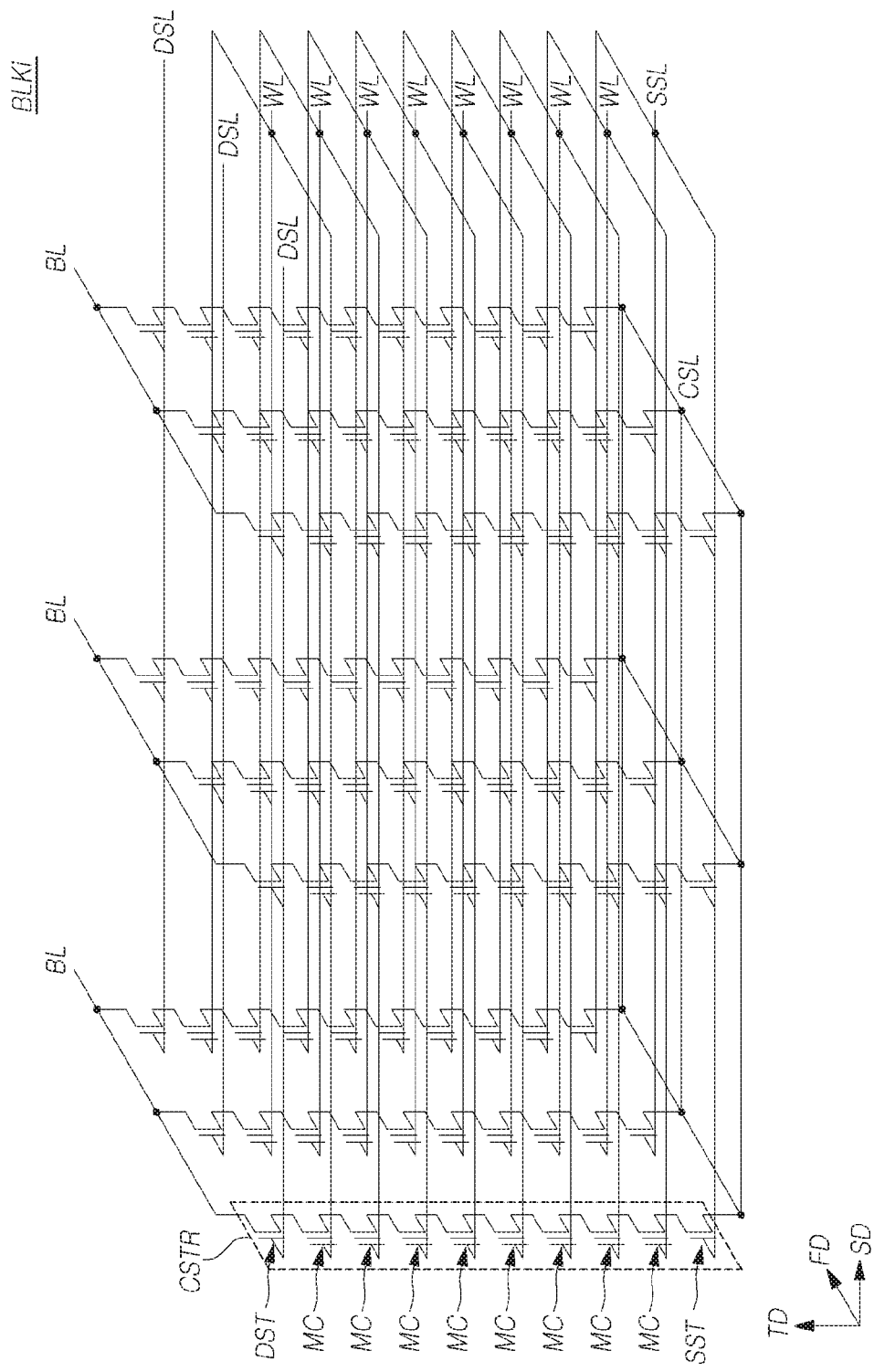
FIG. 2 is an equivalent circuit diagram illustrating an example of one of the memory blocks shown in FIG. 1.

FIG. 2 is an equivalent circuit diagram illustrating an example of one memory block BLKi. The memory block BLKi may correspond to any one among the plurality of memory blocks BLK1 to BLKz shown in FIG. 1.

Referring to FIG. 2, the memory block BLKi may include a plurality of cell strings CSTR which are coupled between a plurality of bit lines BL and a common source line CSL.

The bit lines BL may extend in the first direction FD and be arranged in the second direction SD. A plurality of cell strings CSTR may be coupled in parallel to each of the bit lines BL. The cell strings CSTR may be coupled in common to the common source line CSL. In this case, the plurality of cell strings CSTR may be disposed between the plurality of bit lines BL and one common source line CSL.

Each of the cell strings CSTR may include a drain select transistor DST which is coupled to a bit line BL, a source select transistor SST which is coupled to the common source line CSL, and a plurality of memory cells MC which are coupled between the drain select transistor DST and the source select transistor SST. The drain select transistor DST, the memory cells MC and the source select transistor SST may be coupled in series in the third direction TD.

A source select line SSL, a plurality of word lines WL and drain select lines DSL which extend in the second direction SD may be stacked in the third direction TD between the common source line CSL and the bit lines BL. The drain select lines DSL may be respectively coupled to the gates of corresponding drain select transistors DST. The word lines WL may be respectively coupled to the gates of corresponding memory cells MC. The source select line SSL may be coupled to the gates of source select transistors SST.

Figure 3:
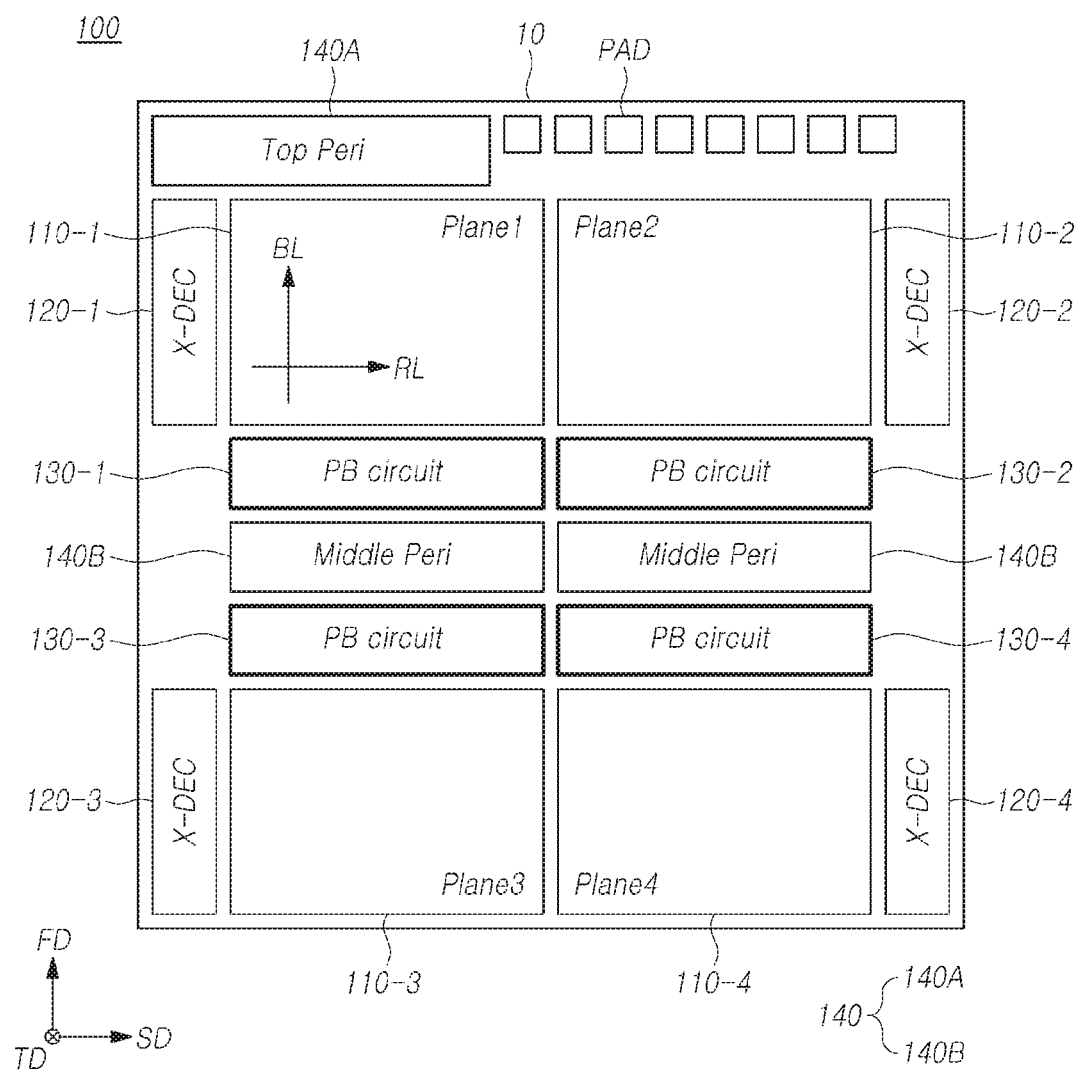
FIG. 3 is a top view schematically illustrating an example of a semiconductor memory device in accordance with an embodiment.

FIG. 3 is a top view schematically illustrating an example of a semiconductor memory device 100 in accordance with an embodiment.

Referring to FIG. 3, four planes 110-1 to 110-4 may be disposed on a substrate 10 in the form of a 2×2 matrix in the first direction FD and the second direction SD.

Each of row decoders 120-1 to 120-4 may be disposed adjacent to a corresponding plane in the second direction SD at a periphery of the substrate 10. Each of the row decoders 120-1 to 120-4 may be disposed to have a shape which extends in the first direction FD as the arrangement direction of row lines RL. Each of the row decoders 120-1 to 120-4 may be disposed to have substantially the same length as a corresponding plane in the first direction FD.

Each of page buffer circuits 130-1 to 130-4 may be disposed adjacent to a corresponding plane in the first direction FD at a center portion of the substrate 10. Each of the page buffer circuits 130-1 to 130-4 may be disposed to have a shape which extends in the second direction SD as the arrangement direction of bit lines BL. Each of the page buffer circuits 130-1 to 130-4 may be disposed to have substantially the same length as a corresponding plane in the second direction SD.

Input/output pads PAD which may operate as the external contacts of a semiconductor memory device 100 for electrical coupling with an external device (not shown) may be disposed in the second direction SD at a periphery of the substrate 10.

A peripheral circuit 140 may be disposed by being distributed at the periphery of the substrate 10 where the input/output pads PAD are positioned and the center portion of the substrate 10. Hereunder, for the sake of convenience in explanation, a part of the peripheral circuit 140 which is disposed at the periphery of the substrate 10 is defined as a first peripheral circuit 140A, and a part of the peripheral circuit 140 which is disposed at the center portion of the substrate 10 is defined as a second peripheral circuit 140B.

While not shown, the first peripheral circuit 140A may be electrically coupled to the input/output pads PAD through a plurality of wiring lines (not shown), and the second peripheral circuit 140B may be electrically coupled to the input/output pads PAD or/and the first peripheral circuit 140A through a plurality of wiring lines (not shown).

As the semiconductor memory device 100 needs to have higher speed and becomes more multifunctional, the number of wiring lines required is increasing, and accordingly, the number of wiring lines to be routed in the first direction FD is increasing as well. For example, in order to couple the input/output pads PAD and the second peripheral circuit 140B or/and couple the first peripheral circuit 140A and the second peripheral circuit 140B, a plurality of wiring lines to be routed in the first direction FD are required.

By utilizing spaces over the planes 110-1 to 110-4, a large number of wiring lines may be disposed. However, since the bit lines BL are arrayed over the planes 110-1 to 110-4, if wiring lines are disposed over the planes 110-1 to 110-4, the wiring lines and the bit lines BL may overlap with each other at a close distance, and an undesired coupling capacitance may be generated where the wiring lines and the bit lines BL overlap with each other, causing an electrical interference between the wiring lines and the bit lines BL.

A high voltage may be loaded in the bit lines BL while the semiconductor memory device 100 operates. For example, by an erase voltage of 20 V or higher applied to the substrate 10 in an erase operation, the bit lines BL may be boosted to a high voltage. In such a case where a high voltage is loaded in the bit lines BL, noise may be generated in the signals transmitted through the wiring lines as the signals are influenced by the high voltage applied to the bit lines BL due to the coupling capacitance between the bit lines BL and the wiring lines, and, in a severe case, the signals may be distorted, causing the operational characteristics and reliability of the semiconductor memory device 100 to deteriorate.

Alternatively, a separate planar area may be added for disposition of wiring lines. In such a case, since it is not necessary to dispose the wiring lines over planes, signal distortion due to the coupling capacitance may be prevented. However, in this case, the size of the semiconductor memory device 100 increases.

Embodiments of the present disclosure proposes a semiconductor memory device capable of disposing a larger number of wiring lines within a limited area without deteriorating operational characteristics and reliability.

Figure 4:
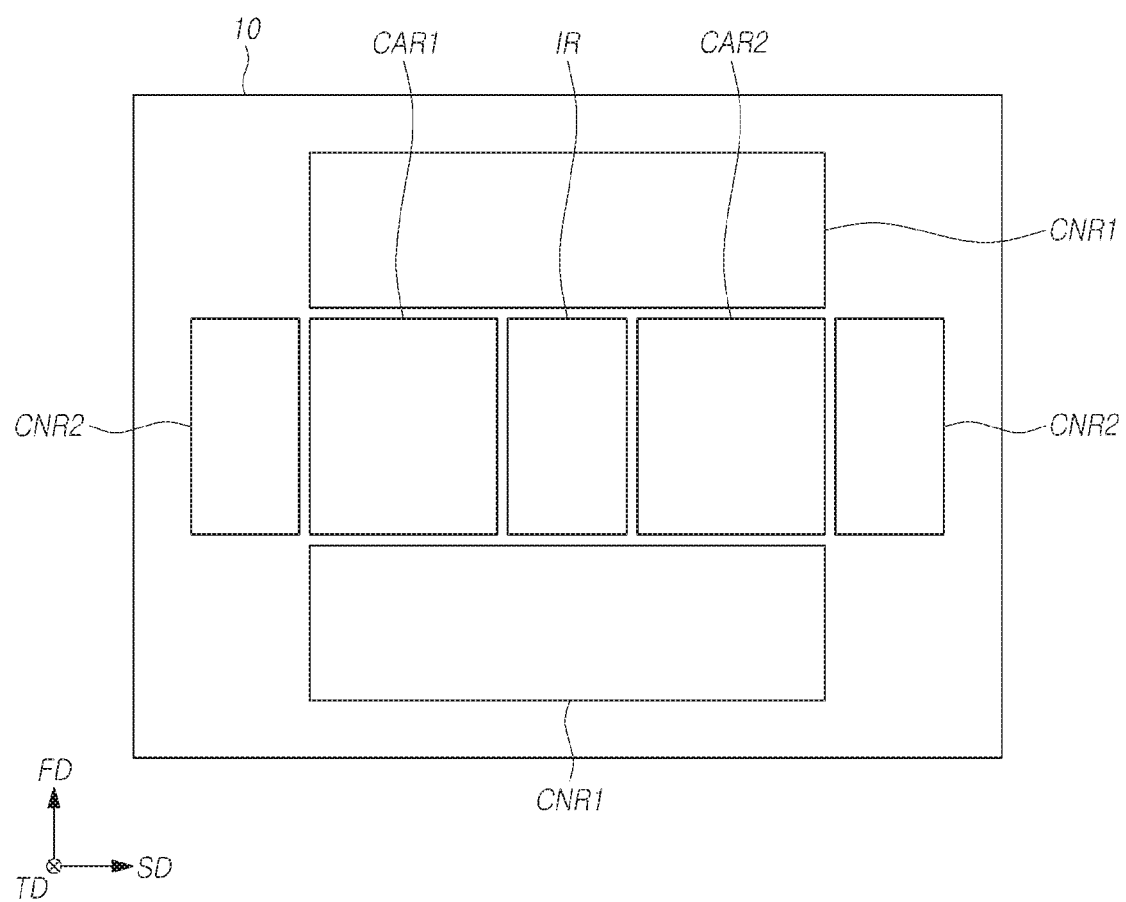
FIG. 4 is a schematic view illustrating an example of the regions of a semiconductor memory device in accordance with an embodiment.
Figure 5:
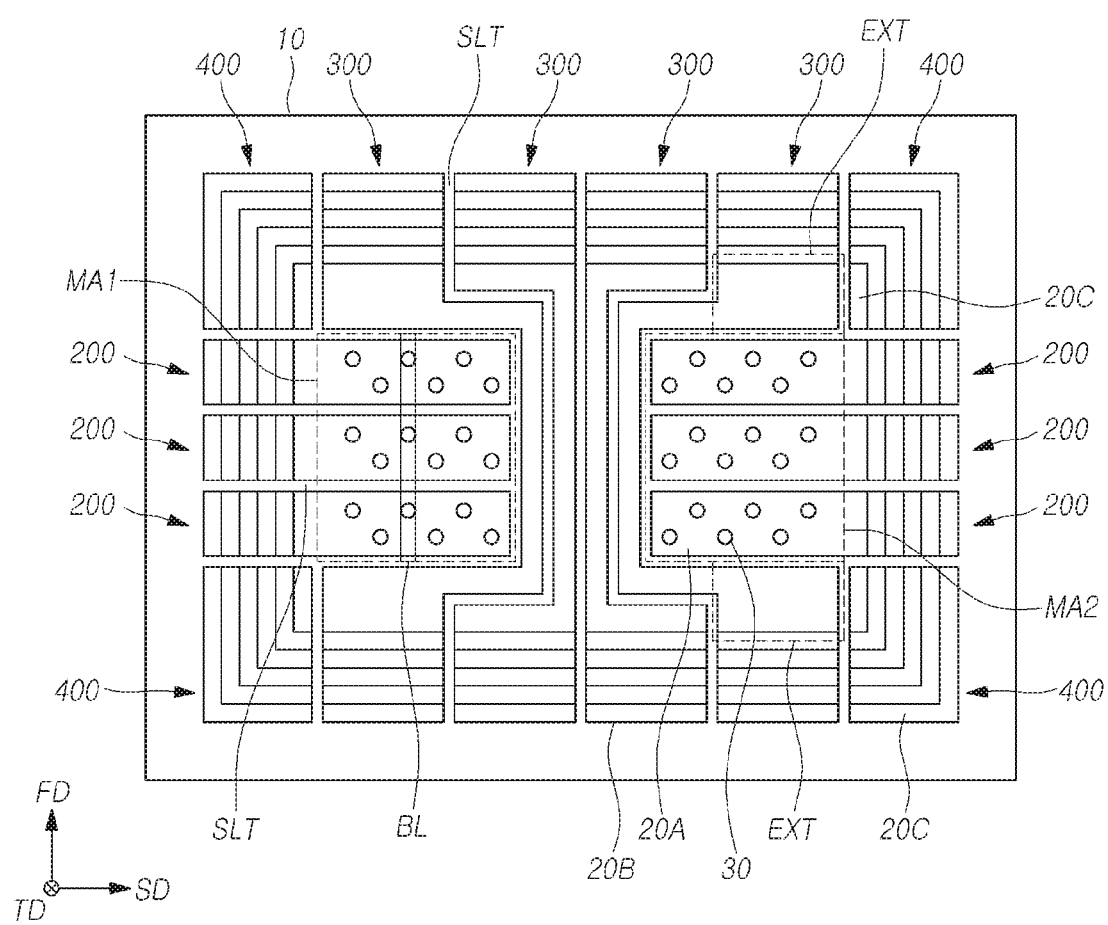
FIG. 5 is a top view illustrating an example of the semiconductor memory device in accordance with the embodiment.
Figure 6:
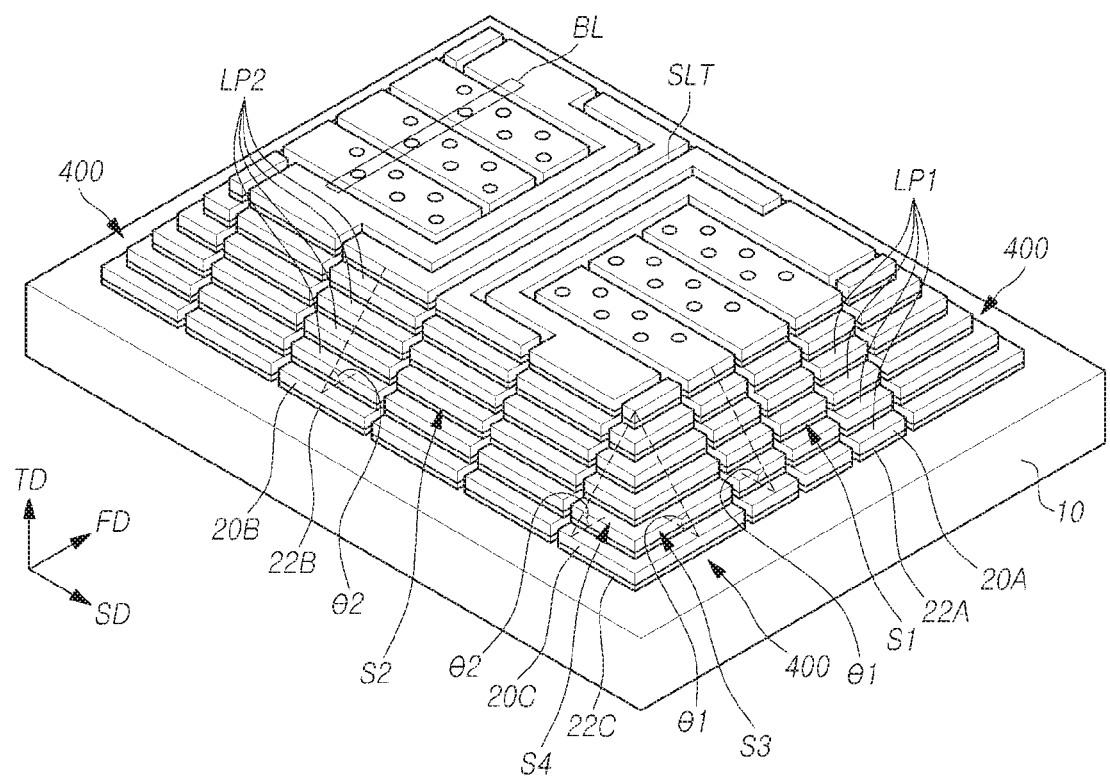
FIG. 6 is a perspective view illustrating an example of the semiconductor memory device in accordance with the embodiment.
Figure 7:
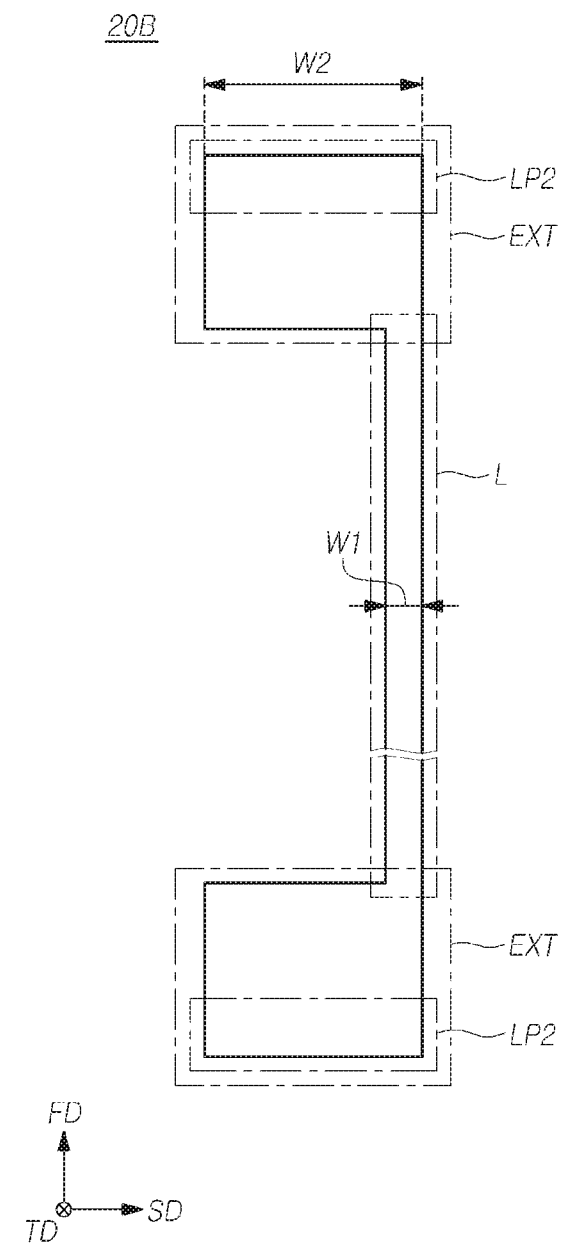
FIG. 7 is a top view illustrating an example of the wiring line of FIG. 6.
Figure 8:
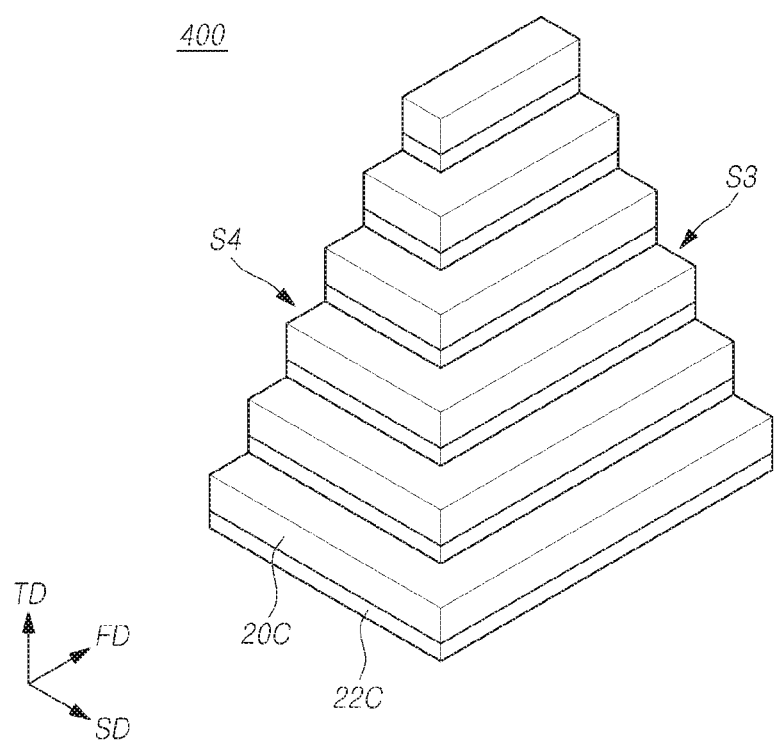
FIG. 8 is a perspective view illustrating an example of the dummy stack of FIG. 6.

FIG. 4 is a schematic view illustrating an example of the regions of a semiconductor memory device in accordance with an embodiment, FIG. 5 is a top view illustrating an example of the semiconductor memory device in accordance with an embodiment, FIG. 6 is a perspective view illustrating an example of the semiconductor memory device in accordance with an embodiment, FIG. 7 is a top view illustrating an example of the wiring line of FIG. 6, and FIG. 8 is a perspective view illustrating an example of the dummy stack of FIG. 6.

Referring to FIG. 4, a semiconductor memory device (such as the semiconductor memory device 100 shown in FIGS. 1 and 3) or a substrate 10 in accordance with an embodiment may include first and second cell array regions CAR1 and CAR2, an interval region IR and coupling regions CNR1 and CNR2.

The first cell array region CAR1 and the second cell array region CAR2 may be disposed in the second direction SD. The interval region IR may be disposed between the first cell array region CAR1 and the second cell array region CAR2. That is, the first cell array region CAR1, the interval region IR and the second cell array region CAR2 may be disposed in a line along the second direction SD.

The coupling regions CNR1 and CNR2 may include a pair of first coupling regions CNR1 which are disposed at both sides of the first and second cell array regions CAR1 and CAR2 and the interval region IR in the first direction FD and a pair of second coupling regions CNR2 which are disposed at both sides of the first and second cell array regions CAR1 and CAR2 and the interval region IR in the second direction SD.

Referring to FIGS. 4 to 6, a plurality of channel structures 30 which pass through gate lines 20A and first dielectric layers 22A and extend in the third direction TD may be defined in the first and second cell array regions CAR1 and CAR2 of the substrate 10. The channel structures 30 may be disposed in such a way as to be separated from one another in the first direction FD and the second direction SD.

While not shown in detail, each of the channel structures 30 may include a channel layer and a gate dielectric layer. By way of example and not limitation, the channel layer may include polysilicon or monocrystalline silicon, and may include a P-type impurity such as boron (B) in some regions. In some embodiments, the channel layer may have the shape of a pillar a solid cylinder which is completely filled up to its center. In some embodiments, the channel layer may have the shape of a tube in which a center region is open. In this case, a buried dielectric layer may be formed in the open center region of the channel layer.

The gate dielectric layer may have the shape of a straw or a cylindrical shell which surrounds the outer wall of the channel layer. The gate dielectric layer may include a tunnel dielectric layer, a charge storage layer and a blocking layer which are sequentially stacked from the outer wall of the channel layer. By way of example and not limitation, the tunnel dielectric layer may include a silicon oxide, a hafnium oxide, an aluminum oxide, a zirconium oxide or a tantalum oxide. By way of example and not limitation, the charge storage layer may include a silicon nitride, a boron nitride, a silicon boron nitride or polysilicon doped with an impurity. By way of example and not limitation, the blocking layer may include a single layer or a stack layer of a silicon oxide, a silicon nitride, a hafnium oxide, an aluminum oxide, a zirconium oxide and a tantalum oxide. In some embodiments, the gate dielectric layer may have an ONO (oxide-nitride-oxide) stack structure in which an oxide layer, a nitride layer and an oxide layer are sequentially stacked.

The gate lines 20A may be stacked in the third direction TD while surrounding the outer surfaces of the channel structures 30. The first dielectric layers 22A may be disposed on and under each of the gate lines 20A. Each of the gate lines 20A may extend from any one of the first and second cell array regions CAR1 and CAR2 to any one of the second coupling regions CNR2 adjacent thereto.

The gate lines 20A may have sidewalls which are adjacent to the interval region IR and are aligned with one another. The sidewalls of the gate lines 20A which are adjacent to the interval region IR may form substantially the same planar surface. The planar surface formed by the sidewalk of the gate lines 20A may be parallel to the third direction TD perpendicular to the top surface of the substrate 10. The planar surface formed by the sidewalls of the gate lines 20A may have a slope with respect to the top surface of the substrate 10 and the third direction TD. In the second coupling regions CNR2, the gate lines 20A may have shapes of which lengths in the second direction SD decrease as the vertical distances thereof from the top surface of the substrate 10 increase. In each of the second coupling regions CNR2, the gate lines 20A may form a first step structure S1 in the second direction SD.

The first step structure S1 may have a first inclination angle θ1 with respect to the top surface of the substrate 10. In the second coupling regions CNR2, each of the gate lines 20A may have a pad region LP1 which is exposed by another gate line 20A positioned on the corresponding gate line 20A. While not shown, a wiring line may be electrically coupled to the pad region LP1 of the gate line 20A through a contact. The pad region LP1 of the gate line 20A may be provided as a contact pad.

The gate lines 20A may be divided by slits SLT which extend in the second direction SD, defining gate line stacks 200. In each of the first and second cell array regions CAR1 and CAR2, a plurality of gate line stacks 200 may be arranged in the first direction FD.

Among the gate lines 20A, at least one layer from the lowermost layer may be used as source select lines, and at least one layer from the uppermost layer may be used as drain select lines. The gate lines 20A between the source select lines and the drain select lines may be used as word lines. Source select transistors may be formed where the source select lines surround the channel structures 30, memory cells may be formed where the word lines surround the channel structures 30, and drain select transistors may be formed where the drain select lines surround the channel structures 30. By the above-described structure, a plurality of cell strings each including a source select transistor, memory cells and a drain select transistor which are disposed along each of the channel structures 30 may be provided.

Cell strings provided in the first cell array region CAR1 may configure a first memory cell array MA1. Cell strings provided in the second cell array region CAR2 may configure a second memory cell array MA2. The first and second memory cell arrays MA1 and MA2 may correspond to two planes which are disposed in the second direction SD, among the planes 110-1 to 110-4 shown in FIG. 3.

Bit lines BL which extend in the first direction FD may be disposed on the gate line stacks 200. While only one bit line BL is illustrated in FIGS. 5 and 6 for the sake of simplification in illustration, it is to be understood that a plurality of bit lines BL are arranged in the second direction SD.

A plurality of wiring lines 20B may be stacked in the interval region IR and the first coupling regions CNR1 of the substrate 10. Second dielectric layers 22B may be disposed on and under each of the wiring lines 20B.

The stack number of the wiring lines 20B may be substantially the same as the stack number of the gate lines 20A. The wiring lines 20B may be disposed at the same layers as the gate lines 20A, respectively.

As the wiring lines 203 may be divided by slits SLT, thereby a plurality of wiring line stacks 300 may be defined. While it is illustrated in the embodiment shown in the drawing that the number of wiring line stacks 300 is 4, it is to be noted that the present disclosure is not limited thereto. The number of wiring line stacks 300 may vary depending on the design requirement. That is, one or more wiring line stacks 300 may be provided.

Referring to FIGS. 4 to 7, each wiring line 203 may include a line portion L and a pair of extended portions EXT which are coupled to both ends of the line portion L.

The line portion L may traverse the interval region IR in the first direction FD, and may have a first width W1 in the second direction SD. The extended portions EXT may be disposed in the first coupling regions CNR1, respectively, and may have a second width W2 larger than the first width W1 of the line portion L in the second direction SD. Due to the fact that the second width W2 of the extended portions EXT is larger than the first width W1 of the line portion L, the wiring line 20B may have the shape of L in the first coupling regions CNR1. While it is described in the present embodiment that the structure of the wiring line 20B in the first coupling regions CNR1 has the shape of L, it is to be noted that the present disclosure is not limited thereto. For example, the structure of the wiring line 20B in the first coupling regions CNR1 may have the shape of T.

Each of the wiring lines 20B may have pad regions LP2 which are exposed by another wiring line 20B located at an upper portion thereof, and provided at ends of the extended portions EXT. In each of the first coupling regions CNR1, the extended portions EXT of the wiring lines 20B may form a second step structure S2 in the first direction FD. The second step structure S2 may have a second inclination angle θ2 with respect to the top surface of the substrate 10. Another wiring line may be electrically coupled to the pad region LP2 of the wiring line 20B through a contact. The pad region LP2 of the wiring line 20B may be provided as a contact pad.

In the second direction SD, the width of the pad region LP2 may be substantially the same as the second width W2 of the extended portion EXT, and may be larger than the first width W1 of the line portion L.

Referring to FIGS. 4 to 6 and 8, dummy stacks 400 may be respectively disposed at the corners between the first coupling regions CNR1 and the second coupling regions CNR2.

Each of the dummy stacks 400 may include a plurality of dummy electrodes 20C and third dielectric layers 22C which are alternately stacked in the third direction TD.

The stack number of the dummy electrodes 20C may be the same as the stack number of the gate lines 20A. The stack number of the dummy electrodes 20C may also be the same as the stack number of the wiring lines 20B. The dummy electrodes 20C may be disposed at the same layers as the gate lines 20, respectively, and may be disposed at the same layers as the wiring lines 203, respectively.

The gate line 20A, the wiring line 203 and the dummy electrode 20C disposed at the same layer may be generated at the same processing step. Due to this fact, the heights and materials of the gate line 20A, the wiring line 20B and the dummy electrode 20C disposed at the same layer may be the same with one another.

The areas of the dummy electrodes 20C may decrease as they are disposed farther from the substrate 10. As the vertical distances of the dummy electrodes 20C from the substrate 10 increase, the lengths of the dummy electrodes 20C in the first direction FD and the widths of the dummy electrodes 20C in the second direction SD may decrease.

One portion along the second direction SD of the dummy electrodes 20C may form a third step structure S3, and other portions along the first direction FD of the dummy electrodes 20C may form a fourth step structure S4.

The sidewalls of the third step structure S3 of the dummy electrodes 20C and the sidewalls of the first step structure S1 of the gate lines 20A which are positioned at the same heights may be disposed on the same planar surfaces. The sidewalls of the fourth step structure S4 of the dummy electrodes 20C and the sidewalls of the second step structure S2 of the wring lines 20B which are positioned at the same heights may be disposed on the same planar surfaces. The third step structure S3 may have substantially the same first inclination angle θ1 as the first step structure S1, and the fourth step structure S4 may have substantially the same second inclination angle θ2 as the second step structure S2.

While not shown, the gate line stacks 200, the wiring line stacks 300 and the dummy stacks 400 may be formed through the processes to be described hereunder.

First, a stack structure is formed by alternately stacking a plurality of electrode layers and a plurality of dielectric layers on the substrate 10, and a mask pattern which covers the center portion of the substrate 10 and has openings exposing portions of the coupling regions CNR1 and CNR2 at the peripheries of the substrate 10 is formed on the stack structure. Then, by alternately and repeatedly performing a unit etching process using the mask pattern as an etch barrier and a trimming process of reducing the length of the mask pattern in the first direction FD and the width of the mask pattern in the second direction SD, step structures are formed in the coupling regions CNR1 and CNR2. Then, by forming slits in the stack structure, the stack structure is divided into the gate line stacks 200, the wiring line stacks 300 and the dummy stacks 400.

According to the present embodiment, by three-dimensionally stacking and forming wiring lines in the space between adjacent memory cell arrays, a larger number of wiring lines may be disposed within a limited area.

Also, by disposing the pad regions of the wiring lines at both sides of the memory cell arrays in a bit line direction, that is, the first direction FD, it is possible to provide the pad regions which have a size larger than the line portions of the wiring lines disposed between the memory cell arrays. Thus, sufficient areas of the pad regions for coupling with contacts may be secured. Further, since the width of the line portions of the wiring lines may be reduced without being influenced by the areas of the pad regions, it is possible to dispose a larger number of wiring lines between the memory cell arrays.

In this way, since it is possible to dispose a larger number of wiring lines between the memory cell arrays, it may not be necessary to dispose wiring lines over bit lines or it is possible to reduce the number of wiring lines to be disposed over bit lines. Therefore, the problem caused in the case where wiring lines are disposed over bit lines, that is, the problem in which signals loaded in wiring lines are distorted due to the coupling capacitance with bit lines, may be solved, whereby the electrical characteristics of a semiconductor memory device may be improved.

Figure 9:
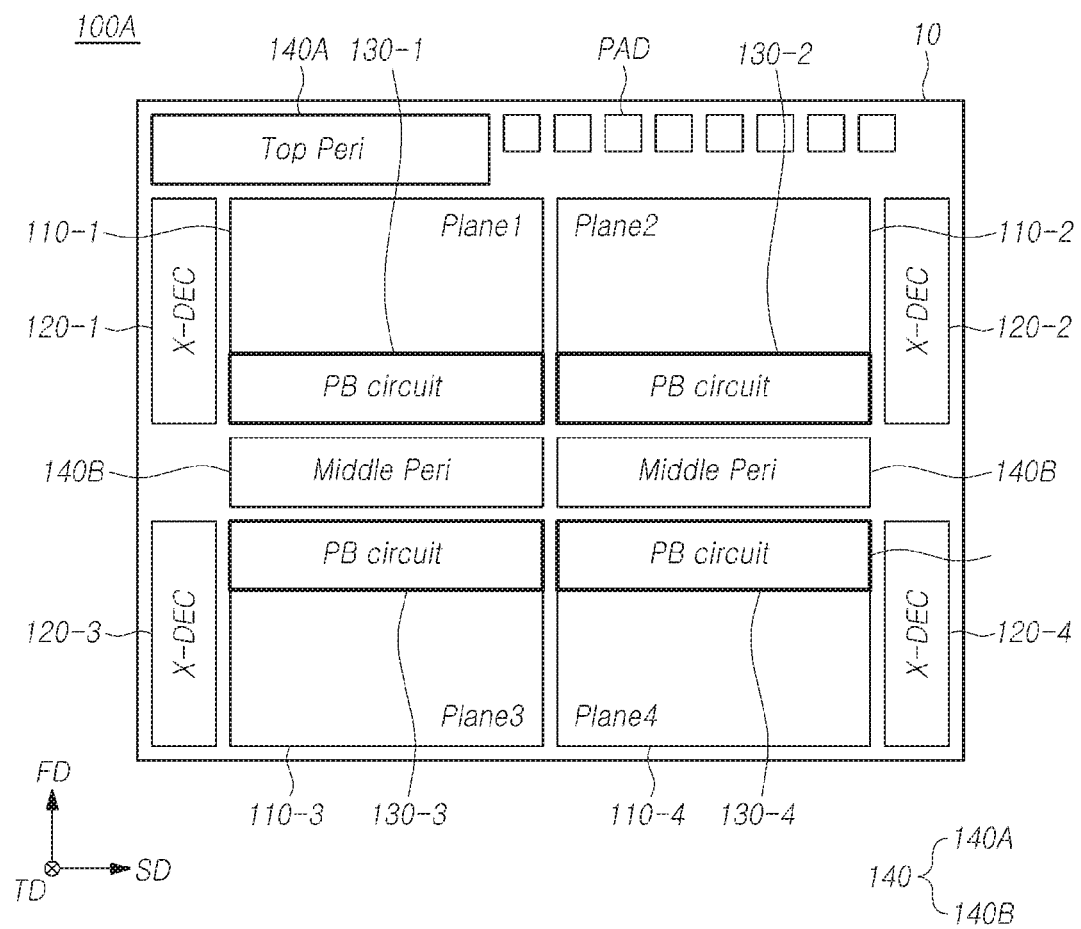
FIG. 9 is a top view schematically illustrating a representation of an example of a semiconductor memory device in accordance with an embodiment.
Figure 10:
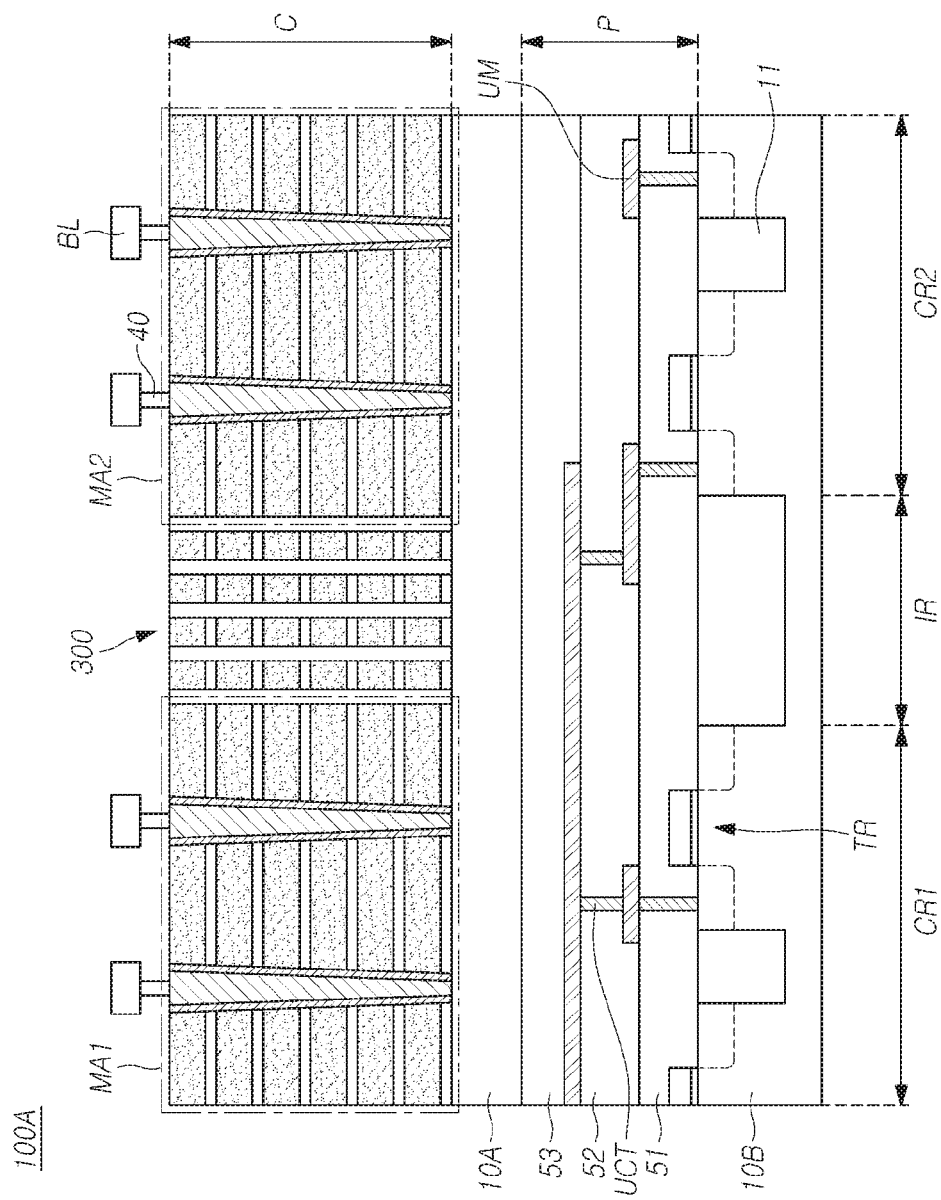
FIGS. 10 and 11 are cross-sectional views illustrating an example of the semiconductor memory device in accordance with the embodiment.

FIG. 9 is a top view schematically illustrating an example of a semiconductor memory device 100A in accordance with an embodiment, and FIG. 10 is a cross-sectional view illustrating an example of a portion of the semiconductor memory device 100A in accordance with the embodiment.

Referring to FIG. 9, row decoders 120-1 to 120-4, page buffer circuits 130-1 to 130-4 and a peripheral circuit 140 (i.e., first peripheral circuit 140A denoted as "Top Peri" and second peripheral circuit 140B denoted as "Middle Peri") may be disposed at a first level, and planes 110-1 to 110-4 may be disposed at a second level. The first level may be lower than the second level.

The page buffer circuits 130-1 to 130-4 may be disposed to overlap with the planes 110-1 to 110-4 in the third direction TD. As the page buffer circuits 130-1 to 130-4 are disposed to overlap with the planes 110-1 to 110-4, the area of a semiconductor memory device 100A may be reduced.

Referring to FIG. 10, a memory structure C may be disposed on a first substrate 10A, and a logic structure P may be disposed on a second substrate 10B disposed under the first substrate 10A.

The second substrate 10B may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer.

The logic structure P may include the row decoders 120-1 to 120-4, the page buffer circuits 130-1 to 130-4 and the peripheral circuit 140 shown in FIG. 9.

The logic structure P may include a plurality of logic circuits. The logic circuits may include horizontal transistors TR. The horizontal transistors TR may be disposed in the active regions of the second substrate 10B which are defined by an isolation layer 11. The logic circuits may configure at least one of the row decoders 120-1 to 120-4, the page buffer circuits 130-1 to 130-4 and the peripheral circuit 140. The logic structure P may include a plurality of bottom wiring lines UM which are electrically coupled to the logic circuits. The bottom wiring lines UM may be electrically coupled to the logic circuits through bottom contacts UCT. The logic structure P may include a bottom dielectric layer which covers the logic circuits, the bottom wiring lines UM and the bottom contacts UCT. While the bottom dielectric layer may include first to third bottom dielectric layers 51, 52 and 53, it is to be noted that the present disclosure is not limited thereto. The first to third bottom dielectric layers 51, 52 and 53 may include a silicon oxide layer, a silicon nitride layer or a silicon oxynitride layer.

The first substrate 10A may be disposed on the third bottom dielectric layer 53. The first substrate 10A may be formed of polycrystalline silicon. Since the first substrate 10A should be formed on the third dielectric layer 53 unlike the second substrate 10B which may use a monocrystalline silicon substrate, the first substrate 10A may be formed of polycrystalline silicon.

The memory structure C may include first and second memory cell arrays MA1 and MA2 and a wiring line stack 300. The first and second memory cell arrays MA1 and MA2 may correspond to two planes which are disposed in the second direction SD, among the planes 110-1 to 110-4 shown in FIG. 9.

The first and second memory cell arrays MA1 and MA2 and the wiring line stack 300 may have structures as illustrated in FIGS. 5 and 6.

Figure 11:
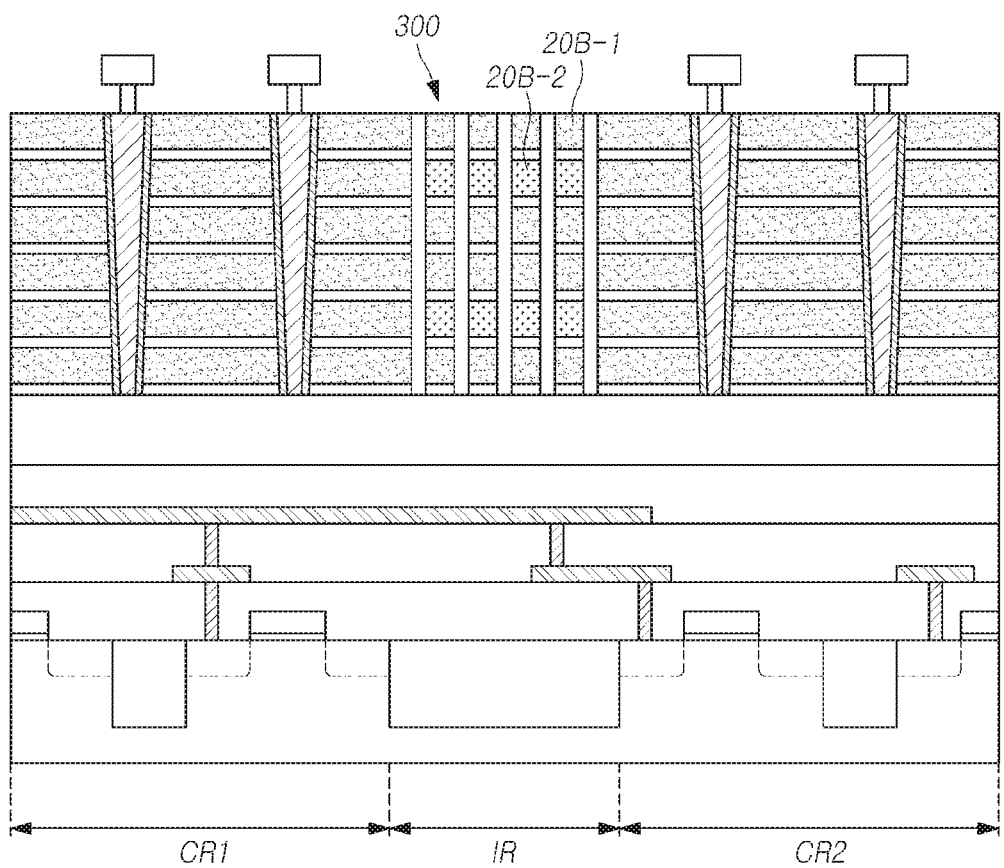

FIG. 11 is a cross-sectional view illustrating an example of a portion of a semiconductor memory device 100B in accordance with an embodiment.

Referring to FIG. 11, wiring lines 20B of a wiring line stack 300 may include signal lines 20B-1 and shielding lines 20B-2. The signal lines 20B-1 may be used in effectively transmitting signals which are related with the operation of a semiconductor memory device. The signals may include, for example, a power signal such as a power supply voltage and a ground voltage, data, a command, an address, and so forth.

Each of the shielding lines 20B-2 may be disposed between signal lines 20B-1 which are stacked adjacent to each other. A ground voltage may be applied to the shielding lines 20B-2. The shielding lines 20B-2 may suppress a coupling phenomenon between the signal lines 20B-1 which are stacked adjacent to each other, and thereby, may prevent distortion of signals to be loaded in the signal lines 20B-1.

Figure 12:
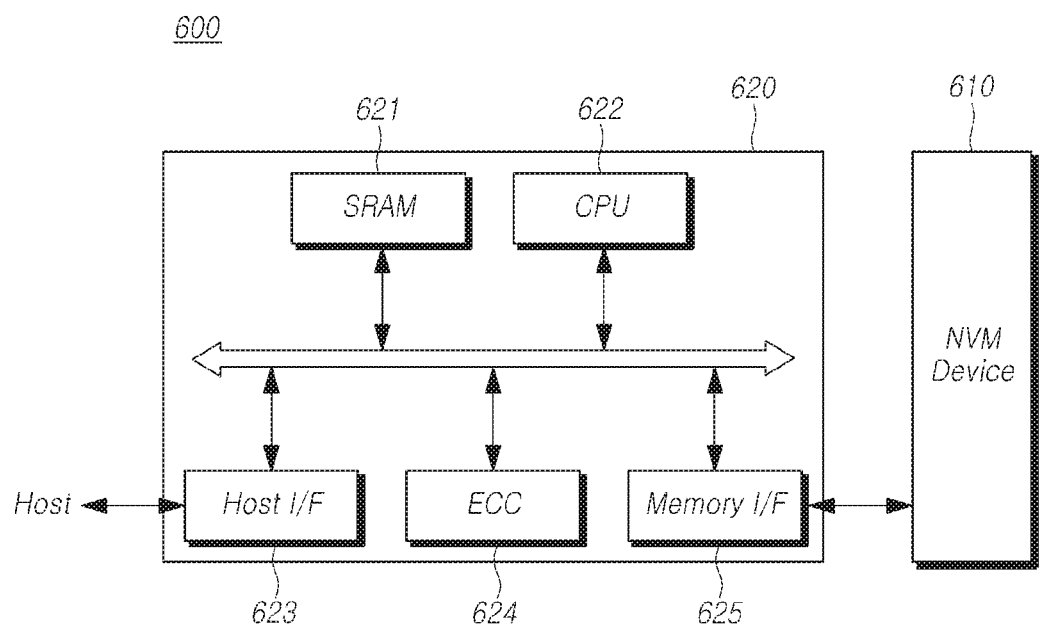
FIG. 12 is a diagram schematically illustrating an example of a memory system including a semiconductor memory device in accordance with an embodiment.

FIG. 12 is a simplified block diagram schematically illustrating a memory system 600 including a semiconductor memory device 610 according to an embodiment of the present invention.

Referring to FIG. 12, the memory system 600 may include the semiconductor memory device 610 and a memory controller 620.

The semiconductor memory device 610 may correspond to the semiconductor memory devices according to various embodiments of the invention as described above, and may be operated in the manner described above. The memory controller 620 may control the semiconductor memory device 610. For example, the combination of the semiconductor memory device 610 and the memory controller 620, may be configured as a memory card or a solid state disk (SSD). The memory controller 620 may include an SRAM 621, a central processing unit (CPU) 622, a host interface 623, an ECC block 624, a memory interface 625.

The SRAM 621 may be used as the working memory of the CPU 622. The host interface 623 may include the data exchange protocol of a host which may be coupled with the memory system 600.

The ECC block 624 may detect and correct an error included in the data read out from the semiconductor memory device 610.

The memory interface 625 may interface with the semiconductor memory device 610. The CPU 622 may perform general control operations for data exchange of the memory controller 620.

Although not shown, it should become apparent to a person skilled in the art that the memory system 600 may further be provided with a ROM which stores code data for interfacing with the host. The semiconductor memory device 610 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid state disk (SSD). The memory controller 620 may communicate with an external device (for example, the host) through one of various interface protocols such as a universal serial bus (USB) protocol, a multimedia card (MMC) protocol, a peripheral component interconnection express (PCI-E) protocol, an serial advanced technology attachment (SATA) protocol, a parallel advanced technology attachment (DATA) protocol, a small computer system interface (SCSI) protocol, an enhanced small disk interface (ESDI) protocol and an integrated device electronics (IDE) protocol and the like.

Figure 13:
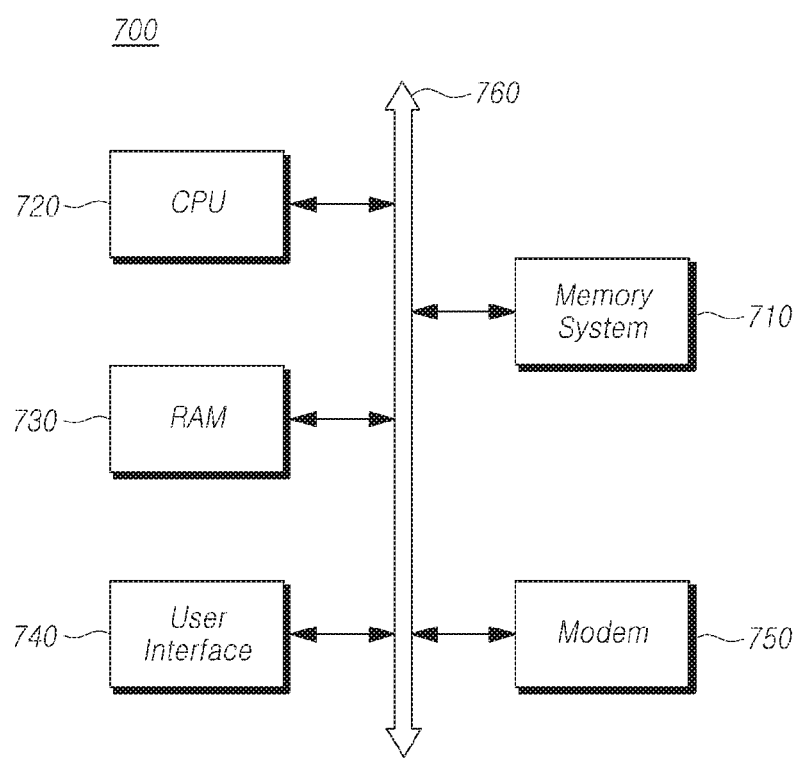
FIG. 13 is a block diagram schematically illustrating an example of a computing system including a semiconductor memory device in accordance with an embodiment.

FIG. 13 is a simplified block diagram schematically illustrating a computing system 700 including a semiconductor memory device, according to an embodiment of the present invention.

Referring to FIG. 13, a computing system 700 according to an embodiment may include a memory system 710, a microprocessor (or CPU) 720, a RAM 730, a user interface 740, a modem 750 such as a baseband chipset, and, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a COMS image sensor (CIS), a mobile DRAM, and so on. The memory system 710 may be configured, for example, as a solid state drive or disk (SSD) which uses a nonvolatile memory to store data. Also, as an example, the memory system 710 may be provided as a fusion flash memory (for example, a NAND or a NOR flash memory).

The above-described embodiments are realized not only by a device and a method, but also they may be realized by a program which performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:
1. A semiconductor memory device comprising:
a plurality of gate lines stacked over a first cell array region and a second cell array region of a substrate which are disposed in a second direction crossing with a first direction, and passed through by channel structures; and a plurality of wiring lines stacked over an interval region of the substrate which is disposed between the first cell array region and the second cell array region and over first coupling regions of the substrate which are disposed at both sides of the first and second cell array regions and the interval region in the first direction, wherein each of the wiring lines includes a line portion which traverses the interval region in the first direction and extended portions which are disposed over the first coupling regions, and wherein the extended portions in each of the first coupling regions constitute a step structure which is formed in the first direction, wherein, in the second direction, a width of the step structure is larger than a width of the line portion.

2. The semiconductor memory device according to claim 1, wherein each of the wiring lines comprises pad regions which are exposed by a wiring line positioned over the each of the wiring lines and are provided at ends of the extended portions.

3. The semiconductor memory device according to claim 1, wherein, in the second direction, a width of the pad regions is the same as the width of the extended portions.

4. The semiconductor memory device according to claim 1, wherein the stack number of the wiring lines is the same as the stack number of the gate lines.

5. The semiconductor memory device according to claim 1, wherein the substrate further includes second coupling regions which are disposed at both sides of the first and second cell array regions and the interval region in the second direction, and wherein each of the gate lines extends to any one of the second coupling regions, and comprises a pad region which is exposed by a gate line positioned over the each of the gate lines in the any one of the second coupling regions.

6. The semiconductor memory device according to claim 5, further comprising:

dummy stacks respectively disposed at corners between the first coupling regions and the second coupling regions, wherein each of the dummy stacks comprises a plurality of dummy electrodes which are vertically stacked.

7. The semiconductor memory device according to claim 6, wherein the stack number of the dummy electrodes is the same as the stack number of the gate lines.

8. A semiconductor memory device comprising:

a first substrate including first and second cell array regions which are disposed in a second direction crossing with a first direction, an interval region between the first cell array region and the second cell array region, first coupling regions which are disposed at both sides of the first and second cell array regions and the interval region in the first direction and second coupling regions which are disposed at both sides of the first and second cell array regions and the interval region in the second direction;

gate line stacks, including a plurality of gate lines which are disposed over the first and second cell array regions and the second coupling regions of the first substrate, extend from the first and second cell array regions to the second coupling regions adjacent thereto and are vertically stacked; and wiring line stacks including a plurality of wiring lines which are disposed over the interval region and the first coupling regions of the first substrate and are vertically stacked, wherein the gate lines have a first step structure which is formed in the second direction in each of the second coupling regions, and the wiring lines have a second step structure which is formed in the first direction in each of the first coupling regions, wherein each of the wiring lines includes a first portion located in the interval region, and a second portion located in each of the first coupling regions, wherein, in each of the first coupling regions, the second portions of the wiring lines constitute the second step structure, wherein, in the second direction, a width of the second step structure is larger than a width of the first portion.

9. The semiconductor memory device according to claim 8, wherein the wiring lines have a first width in the interval region and have a second width larger than the first width in the first coupling regions.

10. The semiconductor memory device according to claim 8, wherein each of the wiring lines comprises pad regions which are exposed by a wiring line positioned over the each of the wiring lines in the first coupling regions.

11. The semiconductor memory device according to claim 8, wherein the wiring lines are disposed at the same layers as the gate lines.

12. The semiconductor memory device according to claim 8, wherein one sidewalls of the gate lines adjacent to the interval region from each side form the same planar surface.

13. The semiconductor memory device according to claim 8, further comprising:

bit lines disposed over the gate lines, and coupled to channel structures which vertically pass through the gate lines, wherein the bit lines extend in the first direction.

14. The semiconductor memory device according to claim 8, further comprising:

dummy stacks including a plurality of dummy electrodes which are disposed at corners between the first coupling regions and the second coupling regions and are vertically stacked.

15. The semiconductor memory device according to claim 14, wherein the dummy stacks include a third step structure which is formed in the second direction and has the same inclination angle as the first step structure and a fourth step structure which is formed in the first direction and has the same inclination angle as the second step structure.

16. The semiconductor memory device according to claim 15, wherein sidewalls of the third step structure and sidewalls of the first step structure which are positioned at the same heights are disposed on the same planar surfaces, and sidewalls of the fourth step structure and sidewalls of the second step structure which are positioned at the same heights are disposed on the same planar surfaces.

17. The semiconductor memory device according to claim 8, wherein the wiring lines comprise:

signal lines configured to transmit signals; and shielding lines configured to suppress a coupling phenomenon between the signal lines which are stacked adjacent to each other, and disposed between signal lines which are stacked adjacent to each other.

18. The semiconductor memory device according to claim 17, wherein a ground voltage is provided to the shielding lines.

19. The semiconductor memory device according to claim 8, further comprising:
a second substrate disposed under the first substrate; and
logic circuits disposed between the first substrate and the second substrate.

20. A semiconductor memory device comprising:
a plurality of gate lines stacked over aligned first and second cell array regions; and
a plurality of wiring lines stacked over a region between and at opposite sides of the cell array regions,
wherein each of the wiring lines includes a first portion running between and across the cell array regions and second portions running at opposite sides of and along with the cell array regions,
wherein, in each of opposite sides of the cell array regions, the second portions of the wiring lines constitute a step structure,
wherein the first portions of the wiring lines have a relatively narrow width, and the step structure have a relatively wider width.

* * * * *